United States Patent [19]

Healey, III et al.

[11] 4,434,407
[45] Feb. 28, 1984

[54] PRESETTING CIRCUIT FOR THE VOLTAGE-CONTROLLED OSCILLATOR OF A PHASE LOCK LOOP

[75] Inventors: Daniel J. Healey, III; Steven Morrison, both of Baltimore, Md.

[73] Assignee: Westinghouse Electric Corp., Pittsburgh, Pa.

[21] Appl. No.: 251,554

[22] Filed: Apr. 6, 1981

[51] Int. Cl.³ .......................... H03L 7/12; H03L 7/16
[52] U.S. Cl. ......................................... 331/4; 331/10; 331/DIG. 2
[58] Field of Search ................... 331/4, 10, 11, 12, 25, 331/DIG. 2

[56] References Cited

U.S. PATENT DOCUMENTS

| | | | |
|---|---|---|---|
| 3,958,186 | 5/1976 | Jesse et al. | 331/4 |
| 4,009,448 | 2/1977 | Hopwood et al. | 331/4 |
| 4,083,015 | 4/1978 | Popodi | 331/4 |
| 4,238,739 | 12/1980 | Mosley et al. | 331/25 X |
| 4,262,264 | 4/1981 | Vandegraaf | 331/4 |
| 4,318,055 | 3/1982 | Hopwood et al. | 331/12 |

Primary Examiner—Siegfried H. Grimm
Assistant Examiner—W. R. Paxman
Attorney, Agent, or Firm—W. E. Zitelli

[57] ABSTRACT

An improved presettable integrator circuit is disposed in a fast frequency changing phase lock loop for presetting the voltage-controlled oscillator thereof as governed by a preset signal and a pulsed signal generated by a frequency controller. One input of the integrator circuit is coupled to the preset signal, another input is coupled to an integrator control signal, and the output is coupled to the voltage-controlled oscillator for use as a tuning signal thereof. A switch is included in the integrator circuit and is governed in a first state by the pulsed signal to cause the integrator circuit to respond rapidly to an applied preset signal to preset the output signal thereof. In a second state, the switch renders the integrator circuit responsive to an integrator control signal which is selected by a phase lock condition of the loop from either a reference signal or a filtered phase error signal, being coupled to the other input of the integrator circuit. Also disclosed are methods for calibrating the voltage-controlled oscillator of the phase lock loop using the improved presettable integrator circuit when the phase lock loop is selectively governed by one of either a first or second frequency reference source.

7 Claims, 7 Drawing Figures

PRESETTING CIRCUIT FOR THE VOLTAGE-CONTROLLED OSCILLATOR OF A PHASE LOCK LOOP

GOVERNMENT CONTRACT CLAUSE

The Government has rights in this invention pursuant to Contract No. F33657-75-C-0310 awarded by the Department of the Air Force.

BACKGROUND OF THE INVENTION

The present invention relates to fast frequency changing phase lock loops and more particularly, to an improved pre-setting circuit disposed therein for presetting the voltage controlled oscillator of the phase lock loop to improve frequency agile operation thereof.

The embodiment depicted in FIG. 1 comprises the components of an elementary phase lock loop. In general, an elemental loop may include a set-point frequency reference source 10 which may provide a set-point frequency signal 12 to one input of a phase detector 14. The output signal 16 of the phase detector 14 may be provided to a loop filter 18 which conditions the signal to provide a filtered signal 20 which governs the output frequency of a voltage controlled oscillator (VCO) 22. The useful output 24 of the phase lock loop is generally taken from the frequency signal generated by the VCO 22.

Usually in an elementary embodiment, output frequency signal 24 or a signal representative thereof may be coupled to the other input of the phase detector 14 along a feedback path 26. For those cases in which an output frequency other than that generated by the set-point frequency source 10 is desired, a conventional down converter 28 may be disposed in the feedback path along with a signal conditioning circuit 30 generally coupled in cascade therewith. The output signal 32 of the conditioning circuit 30 may then be provided to the other input of the phase detector 14. With this configuration, the output frequency signal at 24 or a frequency signal derived therefrom may be adjusted in accordance with a reference frequency signal 34 which may be coupled to another input of the down converter 28.

Typically, phase lock loops of this type may be in either of two conditions, one being referred to as the non-linear mode which is a condition during which phase lock does not exist and the other being referred to as quasi-linear mode which is a condition that exists after phase lock occurs. Phase lock is generally considered a condition in which the difference between the feedback frequency at 32 and set-point frequency at 12 is sufficiently small enough that the phase lock loop can function as a linear control apparatus.

Generally, there are very few problems which exist in the operation of an elementary phase lock loop having a fixed reference frequency at 34. However, there are those systems which require the reference frequency at 34 to be selectively and rapidly switched between a plurality of reference frequencies to alter the output frequency at 24 accordingly. In these systems, if a rapid change in reference frequency results in a frequency difference which exceeds the bandwidth of the phase lock loop, phase lock will be disrupted.

The object of a fast frequency changing or frequency agile phase lock loop is to quickly arrive at a frequency difference in the phase detector 14 to render a phase error signal at 16 within the bandwidth limitations of the phase lock loop to effect a phase lock condition. If the damping of the phase lock loop is adequate, which is generally the case for low noise microwave phase lock loops, phase lock and settling to less than 0.1 radian phase error usually occurs in time less than $4/\pi f_N$), wherein $f_N$ is the natural frequency of the phase lock loop. As an example, suppose the reference frequency signal at 34 is rapidly selectively switched in frequency by say 20 megahertz, for example, and the phase lock loop bandwidth is only on the order of 100 kilohertz, then phase lock can never occur at the new frequency unless a means is provided to change the setting of the voltage control oscillator at 22 to render a frequency difference at the phase detector 14 which is on the order of 100 kilohertz.

Typically, a phase lock loop system (see FIG. 1) may achieve the aforementioned task by providing a preset coarse tune signal to one port 36 of the VCO 22 and may utilize the filtered phase error signal 20 for providing a fine tuning signal coupled to another port 38 of the VCO 22. With this configuration, a phase lock condition may be determined utilizing a synchronous demodulator 40 and a comparison circuit 42. The precision frequency signal 12 may be phase shifted by 90° using a conventional phase shifter 44 and the resulting phase shifted frequency signal may be supplied to one input of the demodulator 40. An inphase I component of the feedback frequency output of the conditioner 30 may be provided to another input of the demodulator 40. A dc signal 46 may be effected by the synchronous demodulator 40 when the phase detector 14 develops an error of less than ±1 radian. Signal 46 is coupled to one input of the comparator 42 and therein compared with a reference signal, denoted as REF, coupled to the other input thereof. At some predetermined comparison condition, an output signal 48 of the comparator 42 may be generate and be indicative of a phase lock condition. This digital signal 48 may be provided to an oscillating integrator circuit 49 to control the coarse tune presetting operation of the VCO 22 by inhibiting the oscillation at the time phase lock is indicated. Once phase lock is established, the quenched oscillating integrator 49 may be governed by the filtered phase error signal 20.

In more specific detail, this typical phase lock loop system may have its reference frequency signal 34 derived from a plurality of crystals 50 switchably selected by a conventional frequency controller 52 via signal line 54 as shown in the embodiment of FIG. 1. The output frequency at 24 of the phase lock loop may then be determined by the selected crystal frequency as controlled by the frequency controller 52. As each new crystal reference frequency is selected, the oscillating integrator 49 is operated to change the coarse tune signal of the VCO 22 to render a phase lock condition of the overall phase lock loop.

A typical circuit for achieving this signal presetting operation is shown within the dotted line block 70 of FIG. 2. The circuit 70 may comprise an integrator I1 and a comparator I2 having its output the other's input connected to with a resistive component. Coupled between the output of comparator I2 and the input of integrator I1 in series with the interconnecting resistive component is an electronic switch S1 for interrupting the signal flow therebetween. The switch S1 may be operated in a closed position at times, when there is no phase lock condition and in an open position, at times, when there is phase lock. The output of the integrator I1 becomes the coarse tune signal for presetting the VCO 22. In addition, the filtered phase error signal 20 may be provided to the oscillating integrator 70 through a buffer amplifier A1 and resistive elements R1 and R2 coupled in series. In this configuration, the other end of R2 may be coupled to the input of the integrator I1 and a second electronic switch S2 may be coupled between ground and the interconnection of R1 and R2. Switch S2 may be operated closed during the out-of-lock condition of the loop and open during a phase lock condition thereof.

In operation, then, as a new crystal reference frequency signal is selected, causing the phase lock loop to be in an out-of-lock condition, the electronic switches S1 and S2 may be rendered closed. In this configuration, the integrator I1 and comparator I2 may operate cooperatively to generate a sawtooth waveform at the coarse tuning port 36 of the VCO 22. During the slow moving slope of the sawtooth waveform, the phase lock loop attempts to achieve phase lock as determined by the synchronous detector 40 and comparator 42. When the phase lock condition is indicated by signal 48, switches S1 and S2 are operated to the open position, thus inhibiting the sawtooth movement of the output of the oscillating integrator 70. In this state, the coarse tune signal is modulated in accordance with the filtered phase error signal 20 provided to the input of integrator I1 through the amplifier A1 and resistors R1 and R2. Accordingly, this operational procedure may be repeated for each newly selected crystal reference frequency.

The foregoing described circuit permitted frequency agile operation by switching the frequency output of the phase lock loop between just a few selectable frequencies utilizing corresponding precision crystal controllably derived frequencies at 50 in FIG. 1. In other applications of the phase lock loop systems, greater numbers of less stable frequencies are sometimes acceptable. In some cases, the number of selectable frequencies specified may be on the order of several hundred. For this purpose, at least one known phase lock loop system employs a reference voltage controlled oscillator 56 (see FIG. 1) to supply the reference frequency 34. The reference VCO 56 may be controlled by the frequency controller 52 utilizing the signal line 58 as shown in the embodiment of FIG. 1. An electronic switch S3 may be included in this configuration to allow the frequency controller 52 to select between the crystal frequency generator 50 and the reference VCO frequency generator 56 to provide the reference frequency signal 34. Because the reference VCO 56 is not considered as stable a frequency reference source as the crystal frequency generators 50, it is generally well understood that periodic calibration of the VCO 56 will be required for achieving the stabilization figures usually specified.

To accommodate the significantly higher number of switchably selectable frequencies at the output 24 of the phase lock loop described in connection with the complete embodiment of FIG. 1, typically a phase lock loop system may provide for an improvement in the oscillating integrator circuit 49 as illustrated by the overall circuit diagram embodiment of FIG. 2. In this embodiment, the frequency controller 52, which is conventionally a digital data processor, supplies a preset signal to the presetting circuitry 49 via a conventional digital-to-analog converter 60 and signal line 62. In addition, a measuring circuit 64 is included to permit the frequency controller 52 to measure the coarse tune signal being applied to the VCO 22. The measuring circuit 64 interfaces with the frequency controller 52 utilizing the signal lines 65. An additional logic signal 66 is provided by the frequency controller 52 to a block of logic shown at 68. The resulting output signals of the logic block provide switch control of the oscillating integrators of the embodiment of FIG. 2.

Referring to FIG. 2, the embodiment includes a second oscillating integrator 72 which comprises an integrator I3 and comparator I4 coupled together in a similar circuit configuration as that of the oscillating integrator 70. Between the output of comparator I4 and input of integrator I3 are disposed two electronic switches denoted as S4 and S5. In addition, a connection is provided from the common connection of resistors R1 and R2 to the input of integrator I3 utilizing a resistive element R3. In this embodiment, the phase error signal 20 may be coupled to both oscillating integrators 70 and 72 for control of the one which is selected for use.

Because the phase lock loop may be operated in either fast agile or slow agile mode, a single-pole-double-throw electronic switch 74 may be included having the outputs of the oscillating integrator 70 and 72 coupled to respective switch positions thereof and having the pole position coupled to the coarse tuning port of the VCO 22. The switch 74 may be operated by a digital signal, denoted as $\overline{FRAGIL}$, generated by the frequency controller 52 via inverter 76. Accordingly, when the slow agile mode is desired switch 74 may be operated to position 1 by one state of the logical signal FRAGIL. Conversely, when the fast agile mode is desired, the switch 74 may be operated to position 2 as governed by the complement of the logical signal $\overline{FRA-GIL}$. The switches S1, S2, and S5 may be operated by the logical combination of the signals FRAGIL and LOKBIT which is the signal 48 generated at the output of comparator 42.

More specifically, the complement of LOKBIT, effected by inverter 78, is utilized to operate switch S2 in a closed position. Switch S1 is controlled to a closed position as a result of the "AND"ing of signals $\overline{FRA-GIL}$ and $\overline{LOKBIT}$. Similarly switch S5 is operated to a closed position as a result of the "AND"ing of signals FRAGIL and LOKBIT. The aforementioned signals controlling switches S1 and S5 are generated by two AND gates 80 and 82, respectively.

On the other hand, the control of the electronic switch S4 is governed by the circuitry depicted in the dotted block 84 which includes a window comparator at 86 and a flip flop 88. The output signal 90 of the flip flop 88 provides the signal to operate switch S4. The window comparator configuration includes two comparators C1 and C2. The minus input of C1 and plus input of C2 are tied together and connected to the output of integrator I3 through a resistive-capacitive filtering arrangement shown at 92. The analog preset signal 62 generated from the D/A converter 60 is provided to the plus input of C1 through an electronic switch S6 and is additionally provided to the minus input of C2 through another electronic switch S7. Coupled between switch S7 and the minus input of C2 is an offset voltage source V1 having its positive terminal connected to the switch and negative terminal connected to the input. In addition, the plus input of C1 is connected to ground through an electronic switch S8 and the minus input of C2 is connected to the minus reference through another electronic switch S9. The electronic switches S6, S7, S8 and S9 are governed in their operation by the logical signal denoted as CALIN generated from the frequency controller 52. More particularly, switches S8 and S9 are operated to their closed position by the signal CALIN and the switches S6 and S7 are operated to their closed positions by the complement of the signal CALIN, (i.e. CALIN). The outputs of the comparators C1 and C2 are coupled to the clock and preset inputs of the flip flop 88, respectively. The output signal 90 of the flip flop is then coupled to the electronic switch S4 for operation thereof.

The measuring circuit 64 includes a conventional sample and hold circuit comprising a buffer amplifier A2 and another amplifier A3 with a sampling switch S10 disposed therebetween. The output of A3 is coupled to the inverting input of A2. Also included in the circuit 64 are two signal-pole-double-throw switches S11 and S12 having the first positions thereof coupled together. The second position of switch S11 is coupled to the non-inverting input of the buffer amplifier A2 and the pole position thereof is coupled to the filtered output of the integrator I3. The second position of switch S12 is coupled to the analog preset signal 62 and the pole thereof is coupled to one input of a conventional comparator circuit C3 also included in the circuit 64. The other input of the comparator C3 is coupled to the output of the amplifier A3. The digital signals denoted as SAMPLE, VCOCAL and GUNCAL, generated by the frequency controller 52 over signal lines 65, govern the operation of the electronic switches S10, S11 and S12, respectively. The output of comparator C3, denoted as CALOUT, is provided to the frequency controller 52 as an indication of a predetermined comparison condition.

In a typical operation of the embodiments depicted in FIGS. 1 and 2, when in the slow agile operational mode, the switches S3 and 74 are appropriately positioned. The frequency controller 52 selects the desirable crystal frequency reference signal which is coupled to the reference signal input of the down converter 28 via switch S3. Concurrently, switch S1 in the oscillating integrator 70 is closed causing the output integrator I1 to oscillate in a sawtooth waveform thus governing the frequency output of the VCO 22 accordingly. When a phase lock condition is established, as indicated by the digital signal 48 denoted as LOKBIT, switches S1 and S2 are both opened. Thereafter the filtered phase error signal 20 is used to govern the output of the integrator I1 for governing the output frequency of the VCO 22.

On the other hand, when the phase lock loop is in the fast agile mode of operation, switches S3 and 74 are both switched to position 2 and thereafter, the frequency controller 52 selects the reference frequency signal from the reference VCO 56. In this mode, the output of the oscillating integrator 72 is used to govern the coarse tune voltage of the VCO 22. Switches S6 and S7 of the window comparator 86 are governed to the closed position applying an appropriately chosen preset signal to the plus and minus inputs of comparators C1 and C2, respectively. Electronic switches S4 and S5 are operated to their closed position until the output of the integrator I3 falls below the preset value at which time the flip flop 88 is clocked and the resultant signal 90 causes the switch S4 to open. The output of integrator I3 continues to fall but at a much slower ramp rate until phase lock is achieved. At the phase lock event, switches S2 and S5 are opened thus providing for governing of the integrator I3 by the filtered phase error signal 20. Should phase lock not occur during a slow ramping cycle of the oscillating integrator 72, the filtered output voltage thereof will fall below the reference voltage of the comparator C2 which renders the output 90 of the flip flop 88 in a state to cause the electronic switch S4 to close starting again the fast ramp cycle of the sawtooth waveform. The fast and slow ramping cycles of the sawtooth waveform may continue cyclically until phase lock is achieved.

As indicated above, with the use of the reference VCO 56 for the setting of the number of switchable selectable output frequency settings desired, the frequency controller 52 must be initially calibrated for the output preset signals 62 and respectively corresponding settings of the reference VCO 56 and thereafter, calibrated from time to time to ensure fast phase lock conditions after a frequency change. A typical calibration procedure may include switching in at prespecified times each one of a plurality of crystal reference frequencies through switch S3 to the down converter 28 as controlled by the frequency controller 52. At each crystal reference frequency setting, the corresponding setting for the reference VCO 56 over digital lines 58 is determined. An illustration of this procedure is depicted in the graph of FIG. 3. On the abscissa, three crystal reference frequencies, as an example case, are marked off and denoted as #1, #2, and #3. In the calibration procedure, the first reference crystal frequency is coupled to the down converter 28 through switch S3 and the digital signal CALIN is made positive thus closing switches S8 and S9. As a result, the window for the comparators C1 and C2 ranges from ground to the minus reference. Consequently, the output of the oscillating integrator 72 is caused to move at the slow ramping rate within the window in one direction and at the fast ramping rate in another direction in accordance with the operation of switch S4.

During the times when there is no phase lock, switches S2 and S5 are held closed. At phase lock, switches S2, S4 and S5 are all in the open position and the output of integrator I3 is sustained substantially by the filtered phase error signal 20. Thereafter, switch S11 is controlled to position 2 in accordance with the state of the logical signal VCOCAL and switch S10 is closed in accordance with the state of the logical signal SAMPLE to store the resulting output signal of integrator I3 at the output of the amplifier A3 which is coupled to one input of the comparator C3.

Next, switch S3 is controlled to the position 2 and the reference VCO 56 is preset to a frequency level relatively equal to the first crystal frequency level (refer to FIG. 3). The process is repeated until phase lock is achieved at the preset value of the reference VCO 56. At this time switches S11 and S12 may be in position 1 as controlled by the logical signals VCOCAL and GUNCAL, respectively. The output of integrator I3 may thus be compared with the previously stored output utilizing the comparator C3. During the phase lock condition, the setting of the reference VCO 56 may be incrementally adjusted with the digital line 58 by the frequency controller 52 until the voltage output of the integrator I3 is moved to a voltage level substantially close to that which has been previously stored at the output of the integrator path A3. The digital signal, denoted as CALOUT, provides to the controller 52 an indication as to when the desired comparison condition of comparator C3 is achieved. When this occurs, the frequency controller 52 stores the digital setting F1 of signal lines 58 in an appropriately chosen memory location whose address corresponds to the crystal frequency #1 setting. This same procedure may be repeated for as many crystal reference frequencies which are being used. As shown by the example of FIG. 3 there are three crystal frequencies and three digital data settings F1–F3 respectively corresponding thereto.

In another calibration procedure, preset signals are calibrated in relation to their corresponding reference VCO frequency settings. Initially, the logical signal CALIN is controlled to a state to open the switches S8 and S9 and close S6 and S7. A predetermined initial value for the preset signal is supplied to the inputs of the comparators C1 and C2. Switch S3 is governed to position 2 and an initial setting is applied to the reference VCO 56 over signal lines 58. The initial setting may be that previously determined for the reference frequency F1 (refer to FIG. 3). An illustration of this calibration procedure is provided through the exemplary graph depicted in FIG. 4.

With the reference frequency signal at 34 set at frequency F1 via VCO 56, lines 58 and frequency controller 52, the oscillating integrator 72 is permitted to operate with its sawtooth ramping function until phase lock occurs. Switches S11 and S12 are operated to their second positions in accordance with the states of their logical control signals. Shortly after phase lock, the output voltage of integrator I3, which is the coarse tune voltage of the PLL VCO22, is captured at the output of the sample and hold amplifier A3. Next, the frequency controller 52 varies the preset signal through the D/A converter 60 which is provided to the other input of the comparator C3 through the switch S12. In comparator C3, the varied preset signal is compared with the captured signal on A3 and when a predetermined comparison condition is effected, the output signal CALOUT provides an indication to the frequency controller 52. Upon reception of the comparison indication, the controller 52 stops adjusting the preset signal and memorizes the current digital signal supplied to the D/A converter 60. This digital signal may be representative of the voltage V1 corresponding to the frequency F1 as shown in FIG. 4.

Now, with the preset signal V1 applied to the comparators C1 and C2 and after a time increment ΔT1, the reference VCO56 is set at a new frequency setting, say ΔF away from F1, for example. As a result of the resetting of the reference VCO frequency, the coarse tune voltage is caused to move in proportion therewith to maintain phase lock in the phase lock loop. The new coarse tune voltage (output of I3) is again captured at the output of sample and hold amplifier A3. Thereafter, frequency controller 52 again varies the preset signal via D/A converter 60 until it receives another comparison indication from C3. Upon reception, the digital signal to the converter 60 is stored in a memory location corresponding to the frequency setting of the reference VCO. This new digital signal is representative of the preset voltage level V11 as shown in the exemplary graph of FIG. 4. Accordingly, the reference VCO56 may be incremented at appropriate time intervals and a corresponding preset voltage may be determined for each new setting as shown illustratively by the exemplary graph of FIG. 4.

Once the calibration procedures just described have taken place, the phase lock loop such as that embodied in FIG. 1 may be controlled to selectively and rapidly switch frequencies at its output in either a slow agile or fast agile mode of operation. It is understood that from time to time another calibration may be required because of time and temperature effects on the various phase lock loop system elements.

As in all present designs, there is always room for improvement. In these types of fast frequency changing phase lock loop designs considerable simplification of circuitry is continuously sought as well as greater reproducible and reliable performance especially in the operations of fast frequency switching and phase lock. The emphasis, in the instant application, is directed to reducing the amount of hardware while improving the reliability and reproducibility in production units especially with respect to the speed at which phase lock is attained. Thus, it is the purpose of the present invention as described by the specification to provide for an improved phase lock loop system particularly in the area of presetting the coarse tune voltage of the PLL VCO for fast frequency changing operations in both of the slow and fast agile modes.

SUMMARY OF THE INVENTION

A phase lock loop circuit operative to switch rapidly between predetermined output frequency signals is governed by a reference frequency signal and a preset signal which are both set to a new level for each desired change in output frequency signal. The desired change in output frequency signals may be, at times, greater than the operational frequency bandwidth of the loop circuit. A voltage-controlled oscillator is included in the loop and governed by at least one tuning signal to generate the output frequency signal of the loop. The frequency signal generated by the voltage-controlled oscillator is operated on by the reference frequency signal to generate a feedback frequency signal. Further included in the loop are a phase detector governed by the feedback frequency signal and a set-point frequency signal to generate a phase error signal; a loop filter for filtering the phase error signal; and a means for detecting a phase lock condition of the loop and for generating a phase lock signal indicative thereof.

In accordance with the present invention, an improvement of the phase lock loop comprises a circuit for generating a tuning signal for controlling the frequency signal of the VCO, the circuit including: an amplifier circuit having an input for coupling the preset signal to the generating circuit; and an integrator circuit having its output coupled to the input of the amplifier circuit through a feedback path, the output signal generated by the integrator circuit being the tuning signal for the VCO. Also included in the generating circuit is a switching means operative in a first state momentarily to render the integrator circuit responsive to the amplifier circuit to preset the output signal of the integrator circuit proportional to the preset signal applied to the input of the amplifier circuit. The switching means is operative in a second state to render the integrator circuit responsive to a reference signal which controls the rate of movement of the output signal of the integrator circuit from its preset level in a direction to cause phase lock of the loop circuit. Moreover, the switching means is operative in a phase lock state as governed by the phase lock signal to render the integrator circuit responsive to the filtered phase error signal, whereby the loop circuit becomes closed to maintain the phase lock condition thereof.

Another aspect of the invention includes a method of calibrating a voltage-controlled oscillator of a phase lock loop which is operated by a frequency controller to switch rapidly between predetermined output frequency signals by governing the application of a reference frequency signal and a preset signal to the phase lock loop. A reference frequency signal is selected by the frequency controller from one of first and second frequency sources. The steps of the method include:

(a) selecting a frequency signal from the first frequency source as the reference frequency signal for application to the loop, (b) supplying a preset signal of a first predetermined value, generated by the frequency controller, to one input of a presettable integrator circuit of the loop with the output signal of the presettable integrator circuit being coupled to the voltage-controlled oscillator of the loop for use as a tuning signal thereof, (c) altering the configuration of the presettable integrator circuit momentarily by the frequency controller to cause the integrator circuit to respond rapidly to the applied preset signal to preset the output signal of the integrator circuit to an amplitude level representative of the value of the applied preset signal, (d) applying a reference signal to another input of the integrator circuit to control the sweep rate of the output signal of the integrator circuit through a predetermined range of amplitudes starting from the preset amplitude level, (e) continuing to sweep the integrator output signal until a phase lock condition is effected in the phase lock loop, (f) applying a phase error signal, derived by the loop, to the another input of the integrator circuit during the phase lock condition to maintain the integrator circuit output signal substantially at a fixed amplitude level, which is the desired tuning signal for the VCO in accordance with the selected reference frequency signal, (g) storing the desired tuning signal in a storage circuit, (h) selecting an initial frequency signal from the second frequency source as the reference frequency signal for application to the loop, (i) applying a preset signal of a second predetermined value from the frequency controller to the one input of the presettable integrator circuit, (j) repeating steps (c) to (f), inclusively, substituting the selected initial frequency signal and the second predetermined value of the preset signal as controlling factors, (k) thereafter, during the phase lock condition, adjusting the second frequency source by the frequency controller to vary the frequency signal output thereof in a direction to cause the amplitude level of the output signal of the integrator circuit to converge with the previously stored desired tuning signal, (l) storing in the frequency controller the adjustment value of the second frequency source which occurs at a time when the amplitude level of the output of the integrator circuit is converged substantially to the previously stored desired tuning signal, (m) thereafter, adjusting the amplitude level of the preset signal of the frequency controller in the direction to converge with previously stored desired tuning signal, and (n) storing in the frequency controller the adjusted amplitude level of the preset signal which is converged substantially to the previously stored desired tuning signal, whereby the stored amplitude of the preset signal corresponds to the frequency signal settings of the first frequency source and a stored adjustment value of the second frequency source associated therewith.

Another aspect of the invention relates to a method of calibrating a voltage-controlled oscillator of a phase lock loop which is operated by a frequency controller to switch rapidly between predetermined output frequency signals by governing the application of a reference frequency signal and a preset signal to the phase lock loop. This method includes the steps of:

(a) adjusting a frequency source by the frequency controller to provide an initial reference frequency value for application to the phase lock loop, (b) applying a preset value signal generated by the frequency controller, to one input of a presettable integrator circuit of the loop with the output signal of the presettable integrator circuit being coupled to the voltage-controlled oscillator of the loop for use as a tuning signal thereof, (c) altering the configuration of the presettable integrator circuit momentarily by the frequency controller to cause the integrator to respond rapidly to the applied preset signal to preset the output signal of the integrator circuit to an amplitude level representative of the value of the applied preset signal, (d) applying a reference signal to another input of the integrator circuit to control the sweep rate of the output signal of the integrator circuit through a predetermined range of amplitudes starting from the preset amplitude level, (e) continuing to sweep the integrator circuit output signal until a phase lock condition is effected in the loop, (f) applying a phase error signal derived by the loop, to the another input of the integrator circuit during the phase lock condition to maintain the integrator output signal substantially at a fixed amplitude level which is the desired tuning signal for the VCO corresponding to the applied reference frequency signal, (g) applying the desired tuning signal to one input of a comparison circuit, (h) applying the preset signal to another input of the comparison circuit, (i) adjusting the preset signal value until it converges to the desired tuning signal as indicated by the comparison circuit, (j) storing the adjustment value of the preset signal concomitant with the convergence indication of the comparison circuit in the memory location corresponding to the applied reference frequency signal value, (k) readjusting the frequency source by the frequency controller to increment the reference frequency signal to a new desired value while maintaining a phase lock condition in the loop, (l) thereafter, applying the stored preset signal value to the one input of the presettable integrator circuit, and (m) repeating steps (c) through (l) inclusively for each desired value of the reference frequency signal.

DESCRIPTION OF THE PREFERRED EMBODIMENT

Figure 1:
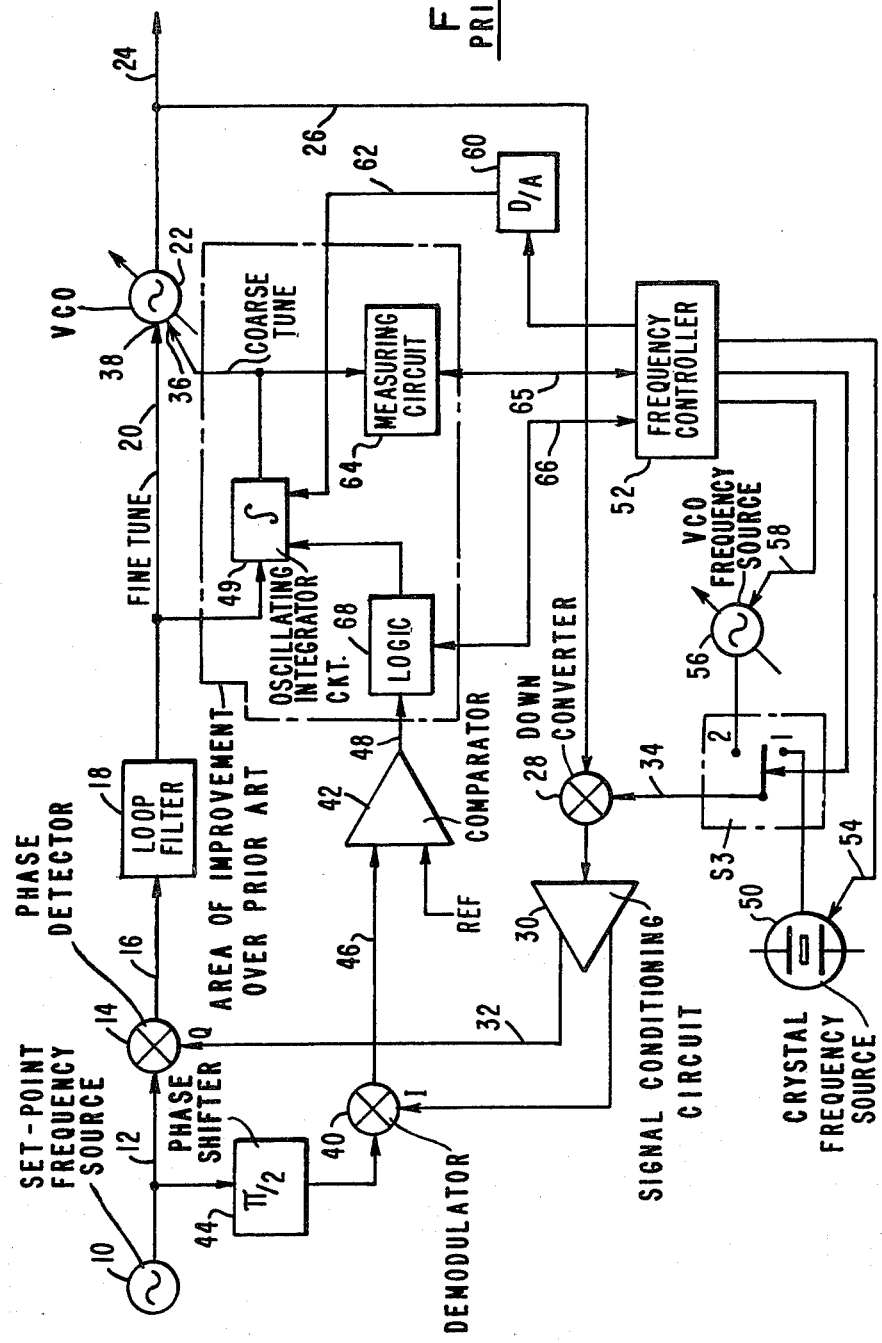
FIG. 1 is a schematic block diagram of a phase lock loop suitable for embodying the principles of the present invention.
Figure 5:
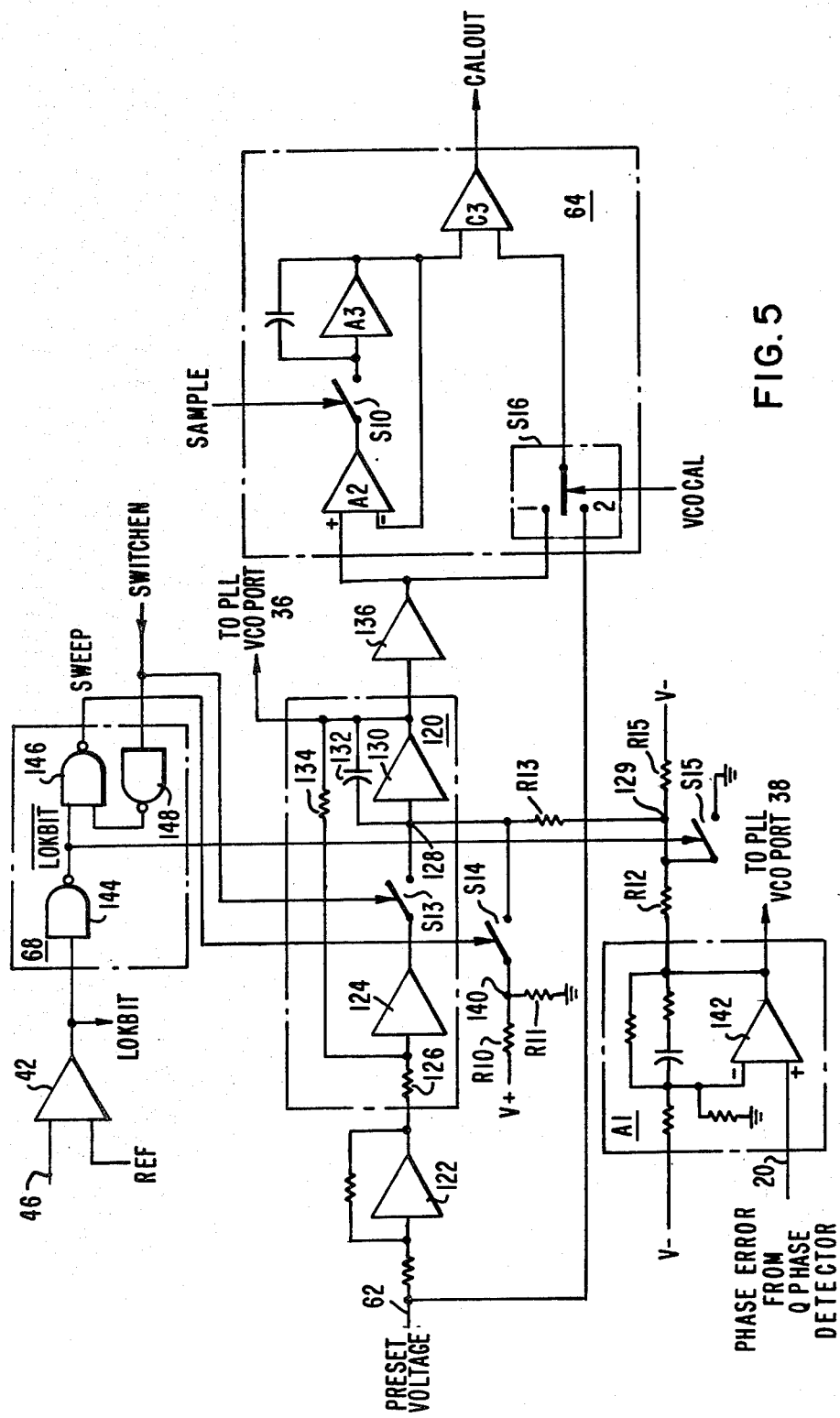
FIG. 5 is a circuit schematic diagram of an improved presetting circuit, including a presettable integrator circuit, governed by a frequency controller and suitable for use in the phase lock loop embodiment of FIG. 1.

The inventive improvement as it applies to a phase lock loop, such as the one described in connection with FIG. 1, for example, will be described herebelow in connection with the embodiment schematically depicted in FIG. 5. Referring to FIG. 5, the preset voltage signal 62 are generated from the D/A converter 60 (refer to FIG. 1) may be coupled to a presettable integrator circuit 120 through a conventional inverting amplifier circuit 122. The output of the inverting amplifier 122 may be coupled to the input of an operational amplifier 124 through a resistive element 126. The output of the amplifier 124 is coupled through an electronic switch S13 to a summing input 128 of another operational amplifier 130 which is configured electrically as an integrator having a feedback capacitor 132 connected between its output and input terminals. The output of amplifier 130 is additionally coupled in a feedback arrangement to the input of the amplifier 124 through another resistive element 134. In the present embodiment, the output of the amplifier or integrator 130 is coupled to the phase lock loop (PLL) VCO coarse tune port 36 and thus used as the coarse tuning voltge thereof.

Figure 2:
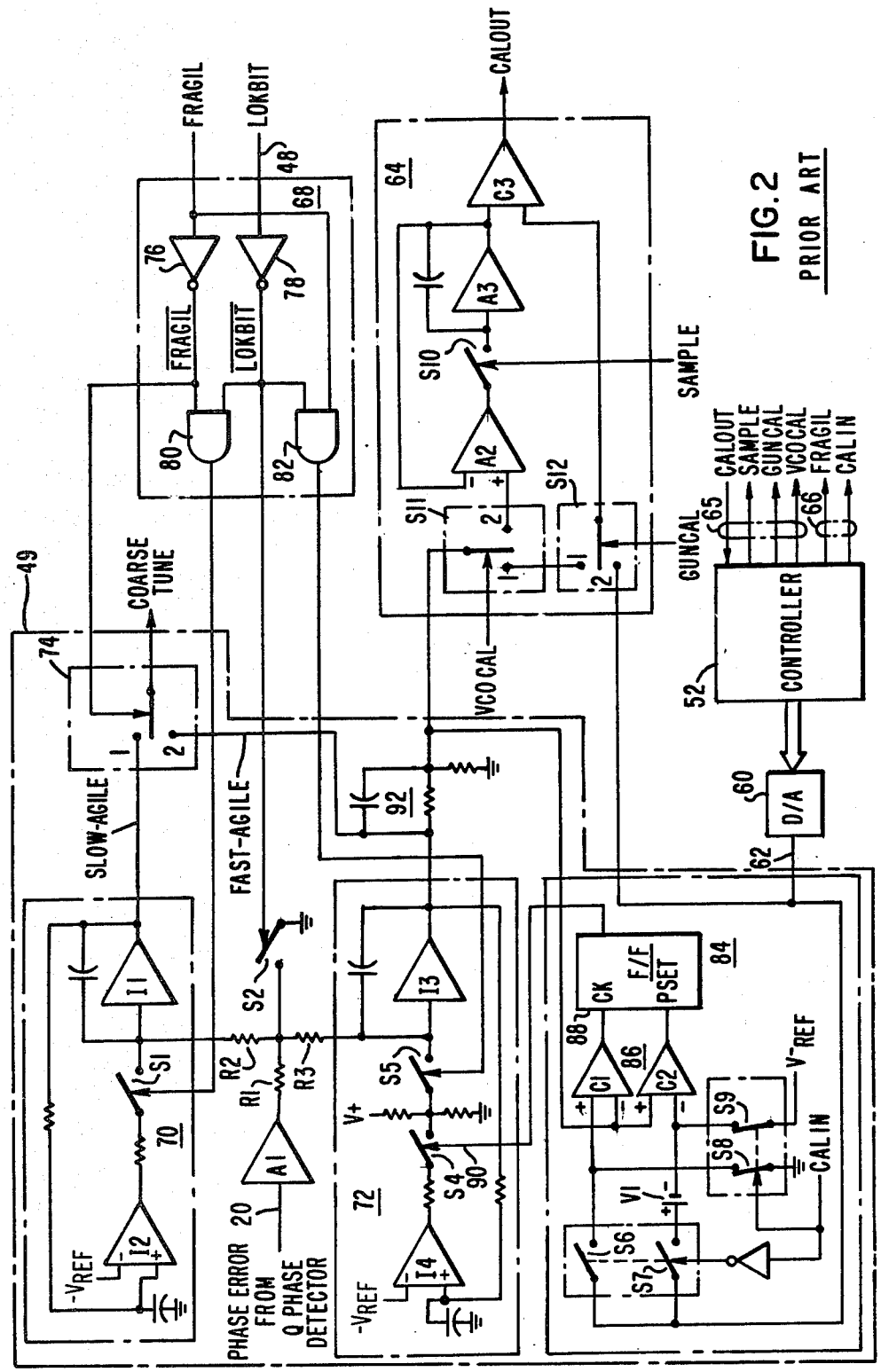
FIG. 2 is a circuit schematic of a typical presetting circuit governed by a frequency controller suitable for use in the phase lock loop depicted in FIG. 1.

The output of integrator 130 is also coupled through a buffer amplifier 136 to the measuring circuit 64 which includes a similar sample-and-hold circuit as that described in connection with the embodiment of FIG. 2. A single pole double throw electronic switch S16 is disposd in the measurement circuit 64 having its pole position coupled to the other input of the comparator C3. Position 1 of switch S16 is coupled to the output of the buffer amplifier 136 and position 2 of the same switch is coupled to the preset voltage signal 62. Electronic switches S10 and S16 are operatively controlled by the logical signals SAMPLE and VCOCAL, respectively, generated by the frequency controller 52. Moreover, the electronic switch S13 in the presettable integrator circuit 120 may be controlled by a logical signal, denoted as SWITCHEN, which is also generated by the frequency controller 52.

A positive voltage reference signal V+ may be coupled to ground potential through two resistive elements R10 and R11 connected in series. The series connection of the resistors may be coupled to the summing junction 128 of the amplifier 130 through another electronic switch S14. The switch S14 may be operatively controlled by the logical signal, denoted as SWEEP, which is derived in the logic block 68 which will be described in greater detail herebelow.

The filtered phase error signal 20 is brought into the improvement embodiment through an amplifier A1 which is configured as a non-inverting amplifier with lag-lead feedback. A negative voltage reference signal V- is coupled to the inverting input of the operational amplifier 142 utilized in the embodiment of A1. The output of amplifier A1 may also be coupled to the summing junction 128 of the integrator 130 through two additional resistive elements R12 and R13 connected in series. The connection 129 of the resistors R12 and R13 is coupled to the negative reference voltage signal V- through another resistive element R15. The series resistive connection 129 may also be coupled to ground through another electronic switch S15 which is operatively controlled by the logical signal LOKBIT as derived by the logic block 68.

The logical signal LOKBIT may be derived in the same manner as that described in connection with the embodiment of FIG. 1 utilizing the comparator 42. The logic block 68 includes an inverter 144 to produce the complement of LOKBIT which is coupled to one input of a NAND gate 146. The logical signal SWITCHEN is also provided to the logic block 68 and therein inverted by the inverter 148 and supplied to the other input of the gate 146. The output of gate 146 denoted as SWEEP is coupled to the electronic switch S14.

In the preferred embodiment as described in connection with FIG. 5 hereabove, the amplifiers 130 and 142 may be implemented with operational amplifiers similar to those having the manufacturing model number LH0032, the amplifier 124 may be of the type having the manufacturing model number LH0002, the amplifier 122 may be of the type having the manufacturing model number LM118 and the comparators C3 and 42 may be of the type having the manufacturing model number LM111. The solid-state electronic switches and the logical gates being used in the instant embodiment may all be implemented using conventional analog and digital designs which are considered well known to those skilled in the pertinent art, the details of which being no part of the present invention.

Figure 3:
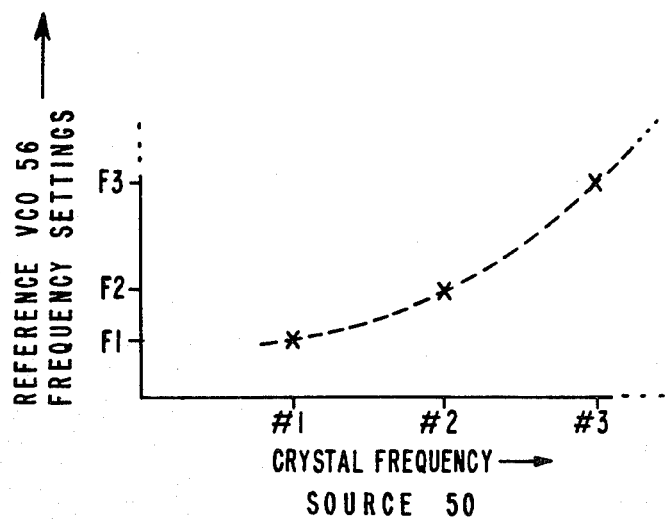
FIG. 3 is a graph illustrating one method of calibrating the voltage-controlled oscillator of a phase lock loop with respect to a first reference frequency source.
Figure 6:
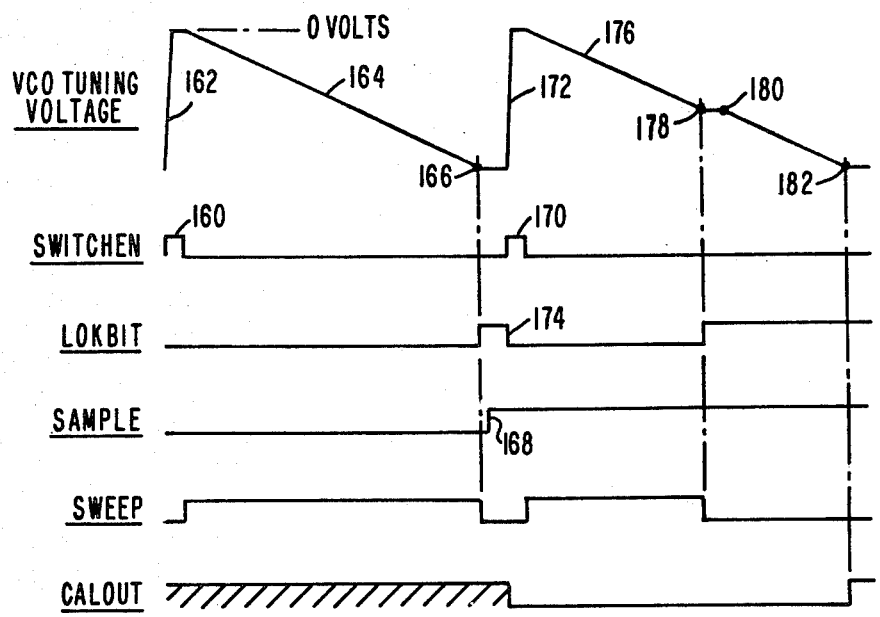
FIG. 6 includes time waveform graphs which illustrate one method of calibrating the voltage-controlled oscillator of a phase lock loop using the improved presettable integrator circuit.

A typical operation of the preferred embodiment will be described herebelow in connection with the time waveform graphs of FIGS. 6 and 7. The waveforms of FIG. 6 exemplify the operational states of the logical control signals SWITCHEN, LOKBIT, SAMPLE, SWEEP, and CALOUT during the calibration mode for the reference VCO 56 (refer to FIG. 3). Further exemplified in FIG. 6, is the response of the coarse tune signal (i.e. output of the integrator 120) in time correspondence with the aforementioned logical control signals. The time waveforms of FIG. 6 are merely for use as an illustration for an operational example and are not to be construed as being drawn to scale.

Referring now to FIGS. 5 and 6, initially the preset voltage 62 may be set to a predetermined voltage level, say like zero volts, for example, and a pulsed signal 160, on the order of 30 microseconds in width, for example, may be generated by the frequency controller 52 over the signal line, denoted as SWITCHEN, to close the electronic switch S13 in the presettable integrator 120, momentarily. This action causes the coarse tune signal, output of integrator 120, to ramp very quickly to the preset voltage level initially set as shown by the time ramp at 162. In time, after the pulse 160, the signal SWEEP is changed in state by the NAND gate 146 as a result of the states of the input signals supplied thereto and causes electronic switch S14 to close, thus causing the coupling of the positive reference signal V+ to the summing junction 128 of the integrator 130. In this circuit configuration with switches S13 open and S15 closed, the coarse tune signal is reduced slowly in a ramp-like fashion as displayed by that portion of the waveform 164. When phase lock is achieved at point 166, as indicated by the change in the logical signal LOKBIT, the SWEEP signal changes state thus causing the switches S14 and S15 to open.

During this phase lock condition, referred to as crystal lock, the coarse tune signal output of the integrator 120 is controlled by the filtered phase error signal 20 via amplifier A1 and resistive elements R12 and R13. At a time 168, shortly after crystal lock, when the output of integrator 120 is maintained substantially constant, the SAMPLE signal is caused to change state to open switch S10 and capture the coarse tune signal or a signal representative thereof at the output of the sample-and-hold amplifier A3 which is also coupled to one input of the comparator C3. At some time after sampling, the SWITCHEN signal is pulsed again at 170 causing the integrator 120 to ramp quickly to the preset voltage as depicted by the portion of the time waveform 172. Concurrently, phase lock of the loop is lost causing a change in state of the signal LOKBIT at 174. After pulse 170, the SWEEP signal is again changed in state causing the electronic switch S14 to close rendering the integrator 120 in a circuit configuration to ramp its output voltage slowly downward as shown by that portion 176 of the time waveform.

Prior to the time pulse 170 the reference VCO 56 may be set close to the crystal frequency. Thus, during the time waveform ramp at 176, the phase lock loop VCO frequency is being swept in search of a phase lock condition with respect to the frequency setting of the reference VCO 56. This is accomplished at the time point 178 as indicated by the change in state of the signal LOKBIT. Simultaneously, the SWEEP signal is caused to change state also thereby configuring the embodiment in a phase lock condition. In time, shortly after point 178, say at point 180, for example, the reference VCO 56 is adjusted incrementally to cause the output of integrator 120, the coarse tune signal, to converge to that previously stored at the output of the sample-and-hold amplifier A3 at time 168.

During the reference VCO calibration, the state of the VCOCAL signal is such to render the electronic switch S16 in position 1 which couples the coarse tune signal to the other input of the comparator C3. Under this circuit configuration, the desired comparison condition is indicated at 182 by a change in state of the signal CALOUT, the output of comparator C3. Thus, at 182, the digital signals over line 58 are stored in an appropriately chosen memory of the frequency controller 52 corresponding to its associated crystal frequency. This procedure, as described in connection with the time waveforms of FIG. 6, may be repeated to determine the reference VCO set points for as many crystal frequencies which are being utilized for a particular application (see FIG. 3).

Figure 4:
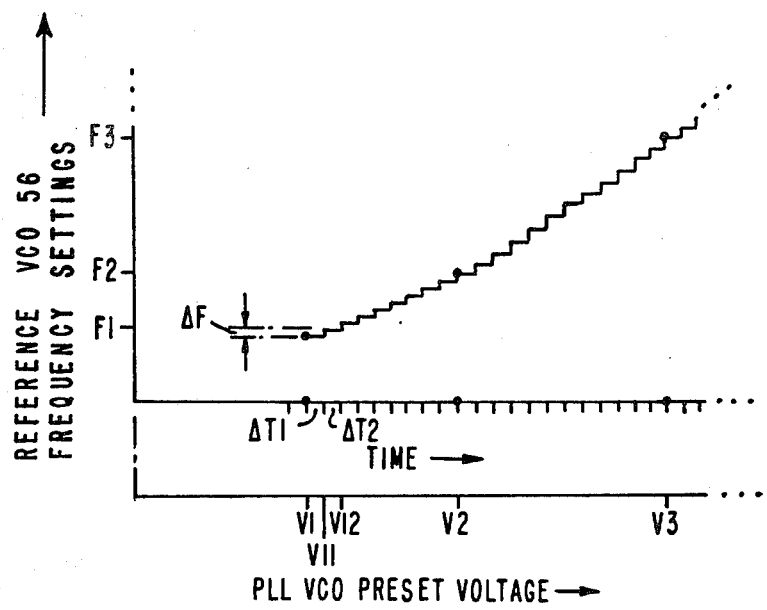
FIG. 4 is a graph illustrating another method of calibrating the voltage-controlled oscillator of a phase lock loop with respect to a second reference frequency source.

After the reference VCO calibration, a second calibration procedure may be conducted in order to derive the values of the preset voltages corresponding to the reference VCO frequency settings desired which may be an order of magnitude greater than the number of crystal frequencies being used, for example. Reference is made to FIGS. 4, 5, and 7 for the following description. In accordance with the calibration procedure described in connection with the time waveform graph of FIG. 4, the reference VCO may be initially set at its first frequency setting F1, for example. And the present voltage may be initially set at zero volts, for example. FIG. 7 is a time graph which relates the coarse tune voltage and preset voltage waveforms to the operations of the logical control signals LOKBIT, SWEEP, and CALOUT. It is well to note that FIG. 7 is provided merely for illustrative purposes and should not be construed as being drawn to scale. In addition, during the time duration as depicted in FIG. 7, the logical control signal VCOCAL is in a state to render the electronic switch S16 at position 2. In this position, the preset voltage signal 62 is coupled to the other input of the comparator C3 (see FIG. 6).

Figure 7:
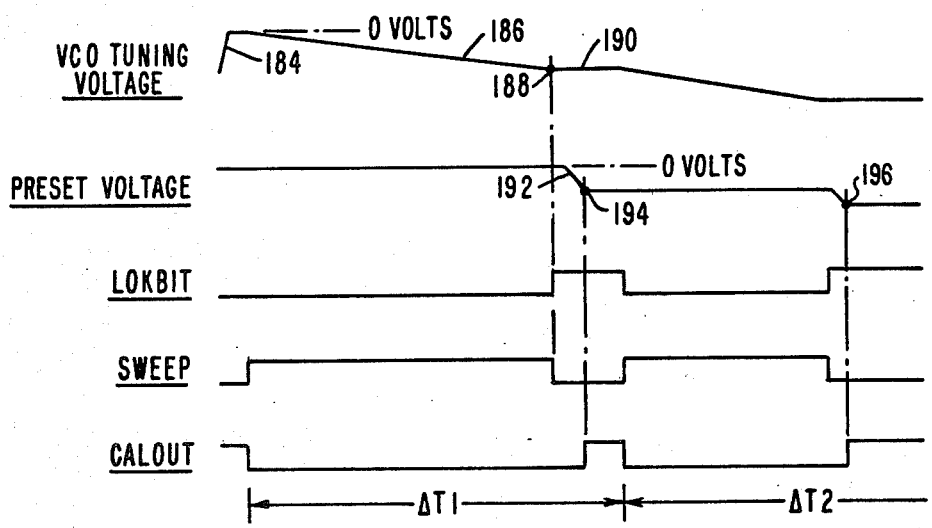
FIG. 7 includes time waveform graphs illustrating another method of calibrating the voltage-controlled oscillator of a phase lock loop using the improved presettable integrator circuit embodiment depicted in FIG. 5.

Referring to FIG. 7, with the preset signal voltage initially set at 0 volts, the output voltage of the integrator circuit 120 may be quickly ramped to the preset voltage level, as depicted by that portion of the time waveform at 184, by pulsing the signal SWITCHEN which momentarily closes electronic switch S13 (see FIG. 7). Thereafter, the signal SWEEP closes switch S14 and causes the output of integrator circuit 120 to move slowly in a downward direction as shown by that portion of the time waveform at 186.

Phase lock is accomplished at point 188 as indicated by a change in state of the signal LOKBIT. In response, switches S14 and S15 are opened during phase lock, and the coarse tune voltage is maintained substantially fixed as depicted by that portion of the waveform at 190. With switch S10 maintained closed, the output of the sample-and-hold amplifier A3 follows the coarse tune voltage and is provided to the one input of the comparator C3 where it may be compared with the preset signal voltage via S16.

Also during phase lock, the preset signal voltage may be varied in a direction to converge to the coarse tune voltage as shown by that portion of the waveform 192. It is worth noting that this change in preset signal voltage will have no effect on the coarse tune voltage since the electronic switch S13 in integrator circuit 120 is open (see FIG. 6). At the desired comparison condition in comparator C3, the signal CALOUT changes state such as that shown at point 194 in the time waveforms. The frequency controller 52 may at this time store into memory the digital word governing the D/A converter 60 which is representative of the instantaneous preset voltage or current coarse tune voltage as the case may be.

The first digital number representative of the preset voltage stored by the frequency controller is illustratively depicted at V11 in FIG. 4. The time events just described in connection with the preset voltage calibration may encompass the time interval as indicated by $\Delta T1$ in the graph of FIG. 4.

After the digital code for V11 is stored in the appropriate memory location of the frequency controller 52, the frequency controller 52 may increment the reference frequency of the VCO 56 an amount $\Delta F$. The current preset voltage level as shown at point 194 of FIG. 7 may remain supplied to the amplifier 122 and switch S16 and the sequence of events just described in connection with FIG. 7 may be repeated for a second time interval, say $\Delta T2$, for example. Likewise at the end of the $\Delta T2$ interval, the digital signal controlling the D/A converter 60, representative of the new preset voltage, such as that shown at point 196 in the time waveform of FIG. 7 may be stored in another memory location consistent with the classification V12 as shown in the graph of FIG. 4. Accordingly, these calibration steps which have been described in connection with time intervals $\Delta T1$ and $\Delta T2$ may be repeated at subsequent time intervals for as many reference frequency points as are desired as illustrated by the exemplary graph of FIg. 4.

After the preferred embodiment has been initially calibrated, each time a new frequency is desired at the output of the phase lock loop (see FIG. 1), the frequency controller 52 may concurrently set both the reference frequency at 34 (i.e. selection at switch S3) and the corresponding preset voltage taken from its memory location and output via D/A converter 60 and line 62. With the switch S13 pulsed momentarily closed, the new preset voltage is rendered at the output of the integrator circuit 120 and becomes the new coarse tune voltage for the phase lock loop VCO 22. Due to the combinational logic of the elements of block 68, the integrator circuit 120 sweeps preferably at a fixed rate until phase lock is established. At phase lock, switches S14 and S15 are both open and the phase lock loop VCO 22 is controlled exclusively, at least in the preferred embodiment, by the filtered phase error signal from line 20 via amplifier A1 and resistive elements R12 and R13. This condition is maintained until another frequency change is executed.

In comparing the preferred embodiment of the invention, as described in connection with the schematic block diagram of FIG. 5, with at least one previously known embodiment shown schematically in FIG. 2 and described in detail in the Background section hereabove, a number of advantageous differences become evident. For example, the known embodiment of FIG. 2 requires five logic signals for interface with the frequency controller and twelve electronic analog switches for operation, while the preferred embodiment of FIG. 5, uses only three interface logic signals and five solid-state switches.

A principle difference between the two embodiments is the use of a single presettable integrator circuit 120 for both the slow agile and fast agile operational modes, rather than the two separate oscillating integrators 70 and 72 which were eliminated in the preferred embodiment. The window comparator circuitry 84 which was used to preset the oscillating integrator 72 to the preset signal voltage 62 was also eliminated in the improved embodiment (FIG. 5). Instead, in the preferred embodiment, the preset signal 62 is coupled directly to the presettable integrator circuit 120 and preset is accomplished under the control of the integrator switch S13 is governed directly by the signal (SWITCHEN) provided by the frequency controller 52. In addition, the response time for the preferred embodiment to attain phase lock after a frequency change occurs is expected to be reproducible from one unit to another because of the inventive improvements as described hereabove.

What we claim is:

1. A phase lock loop circuit operative to switch rapidly between predetermined output frequency signals as governed by a reference frequency signal and a preset signal which are both set to a new level for each desired change in output frequency signal, the desired change in output frequency signals being, at times, greater than the operational frequency bandwidth of said phase lock loop circuit, said phase lock loop circuit including: a voltage controlled oscillator (VCO) governed by a tuning signal to generate the output frequency signal of said phase lock loop circuit; means for operating on a said output frequency signal by said reference frequency signal to generate a feedback frequency signal; a phase detector for generating a phase error signal representative of the phase difference between said feedback frequency signal and a set-point frequency signal; a loop filter for filtering said phase error signal and means for detecting a phase lock condition of said phase lock loop circuit and for generating a phase lock signal indicative thereof; and wherein the iprovement comprises a circuit for generating said tuning signal for controlling the output frequency signal of said VCO, said generating circuit including:

an amplifier circuit having an input for coupling said preset signal to said generating circuit;

an integrator circuit having its output coupled to the input of said amplifier circuit through a feedback path, the output signal generated by said integrator circuit being said tuning signal for said VCO; and switching means operative in a first state momentarily to render said integrator circuit responsive to said amplifier circuit to preset the output signal of said integrator circuit proportional to said preset signal applied to the input of said amplifier circuit, said switching means operative in a second state to render said integrator circuit responsive to a reference signal which controls the rate of the output signal of said integrator circuit from its preset level in a direction to cause phase lock of said loop circuit, said switching means operative in a phase lock state as governed by said phase lock signal to render said integrator circuit responsive to said filtered phase error signal, whereby said loop circuit becomes closed to maintain the phase lock condition thereof.

2. A phase lock loop circuit in accordance with claim 1 wherein the switching means includes:

a first switch operative during the first state to connect the output of the amplifier circuit to the input of the integrator circuit;

a second switch for coupling the reference signal to the input of the integrator circuit, at times, when a phase lock condition is not indicated by the phase lock signal; and a third switch for coupling the filtered phase error signal to the input of the integrator circuit when a phase lock condition is indicated by the phase lock signal.

3. A phase lock loop circuit in accordance with claim 1 including a measurement circuit comprising:

a sample-and-hold (S/H) circuit having an input, an output and a sampling switch, said input thereof being coupled to the output of the integrator circuit, said S/H circuit being operative to sample the integrator circuit output signal in one state of said sampling switch and to hold the integrator circuit output signal at its output in another state of said sampling switch;

a comparator circuit having at least two inputs and an output with one input thereof coupled to the output of said S/H circuit, said comparator circuit being operative to generate an output signal in response to a predetermined comparison condition with respect to the levels of the signals coupled to the two inputs thereof; and a switch disposed between the integrator circuit and said comparator circuit and having one input for coupling the output signal of the integrator circuit to said switch, another input for coupling the preset signal of the phase lock loop to said switch and an output coupled to the other of the two inputs of said comparator circuit, said switch being operative in one state to couple the output signal of the integrator to said other input of the comparator circuit and in another state to couple the preset signal to said other input of the comparator circuit.

4. Method of calibrating a voltage-controlled oscillator (VCO) of a phase lock loop (PLL) which is operated by a frequency controller to switch rapidly between predetermined output frequency signals by governing the application of a reference frequency signal and a preset signal to the PLL, said reference frequency signal being selectable by said frequency controller from one of first and second frequency sources, said method including the steps of:

(a) selecting a frequency signal from said first frequency source as said reference frequency signal for application to said phase lock loop;

(b) applying a preset signal of a first predetermined value, generated by said frequency controller, to one input of a presettable integrator circuit of said phase lock loop with the output signal of said presettable integrator circuit being coupled to said voltage controlled oscillator of said phase lock loop for use as a tuning signal thereof;

(c) altering the configuration of said presettable integrator circuit momentarily by said frequency controller to cause said integrator circuit to respond rapidly to said applied preset signal to preset the output signal of said integrator circuit to an amplitude level representative of the value of said applied preset signal;

(d) applying a reference signal to another input of said integrator circuit to control the sweep rate of the output signal of said integrator circuit through a predetermined range of amplitudes starting from the preset amplitude level;

(e) continuing to sweep said integrator output signal until a phase lock condition is effected in said phase lock loop;

(f) applying a phase error signal, derived by said phase lock loop, to said another input of said integrator circuit during said phase lock condition to maintain said integrator circuit output signal substantially at a fixed amplitude level which is the desired tuning signal for said VCO in accordance with said selected reference frequency signal;

(g) storing said desired tuning signal in a storage circuit;

(h) selecting an initial frequency signal from said second frequency source as said reference frequency signal for application to said phase lock loop;

(i) applying a preset signal of a second predetermined value from said frequency controller to said one input of said presettable integrator circuit;

(j) repeating steps (c) to (f), inclusively, substituting said selected initial frequency signal and said second predetermined value of said preset signal as controlling factors;

(k) thereafter, during the phase lock condition, adjusting the second frequency source by the frequency controller to vary the frequency signal output thereof in a direction to cause the amplitude level of the output signal of said integrator circuit to converge with said previously stored desired tuning signal;

(l) storing in the frequency controller the adjustment value of said second frequency source which occurs at a time when the amplitude level of the output of said integrator circuit is converged substantially to said previously stored desired tuning signal, whereby the stored adjustment value of the second frequency source provides substantially the same tuning signal at the output of the integrator circuit as that corresponding to the selected frequency signal of said first frequency source;

(m) thereafter, adjusting the amplitude level of the preset signal by the frequency controller in a direction to converge with said previously stored desired tuning signal; and (n) storing in the frequency controller the adjusted amplitude level of said preset signal which is converged substantially to said previously stored desired tuning signal, whereby the stored amplitude level of said preset signal corresponds to the selected frequency signal settings of said first frequency source and the stored adjustment value of said second frequency source associated therewith.

5. The method in accordance with claim 4 wherein the step (l) includes the steps of:

coupling the stored desired tuning signal to one input of a comparator circuit;

coupling the output of said integrator circuit to another input of said comparator circuit;

comparing the signals applied to said one and another inputs of said comparator circuit during the phase lock condition when the second frequency source is being adjusted by the frequency controller;

generating a comparison signal by said comparator circuit when a desired comparison condition occurs between the signals coupled to the one and another inputs thereof; and storing in the frequency controller the adjustment value of the second frequency source concurrent with said comparison signal generation.

6. The method in accordance with claim 4 wherein the step (n) includes the steps of:

coupling the stored desired tuning signal to one input of a comparator circuit;

coupling the preset signal to another input of said comparator circuit;

comparing the signals applied to said one and another inputs of said comparator circuit during the adjustment of the amplitude level of the preset signal by the frequency controller;

generating a comparison signal by said comparator circuit when a desired comparison condition occurs between the signals coupled to the one and another inputs thereof; and storing in the frequency controller the adjustment value of the preset signal concurrent with said comparison signal generation.

7. Method of calibrating a voltage-controlled oscillator of a phase lock loop which is operated by a frequency controller to switch rapidly between predetermined output frequency signals by governing the application of a reference frequency signal and a preset signal to the phase lock loop, said method including the steps of:

(a) adjusting a frequency source by said frequency controller to provide an initial reference frequency value for application to said phase lock loop;

(b) applying a preset signal value generated by said frequency controller, to one input of a presettable integrator circuit of said phase lock loop (PLL) with the output signal of said presettable integrator circuit being coupled to said voltage controlled oscillator (VCO) of said PLL for use as a tuning signal thereof;

(c) altering the configuration of said presettable integrator circuit momentarily by said frequency controller to cause said integrator to respond rapidly to said applied preset signal to preset the output signal of said integrator circuit to an amplitude level representative of the value of said applied preset signal;

(d) applying a reference signal to another input of said integrator circuit to control the sweep rate of the output signal of said integrator circuit through a predetermined range of amplitudes starting from the preset amplitude level;

(e) continuing to sweep said integrator output signal until a phase lock condition is effected in said phase lock loop;

(f) applying a phase error signal, derived by said phase lock loop, to said another input of said integrator circuit during said phase lock condition to maintain said integrator output signal substantially at a fixed amplitude level which is the desired tuning signal for said VCO corresponding to the applied reference frequency signal;

(g) applying said desired tuning signal to one input of a comparison circuit;

(h) applying said preset signal to another input of said comparison circuit;

(i) adjusting said preset signal value until it converges to the desired tuning signal as indicated by said comparison circuit;

(j) storing said adjustment value of said preset signal concomitant with the convergence indication of said comparison circuit in a memory location corresponding to said applied reference frequency signal value;

(k) re-adjusting the frequency source by said frequency controller to increment the reference frequency signal to a new desired value while maintaining a phase lock condition in said loop;

(l) thereafter, applying the current preset signal value to the one input of said presettable integrator circuit; and (m) repeating steps (c) through (l) inclusively for each desired value of said reference frequency signal.

* * * * *